US012190978B2

(12) United States Patent
Hsu et al.

(10) Patent No.: US 12,190,978 B2
(45) Date of Patent: *Jan. 7, 2025

(54) MEMORY TEST SYSTEM AND MEMORY TEST METHOD

(71) Applicant: NANYA TECHNOLOGY CORPORATION, New Taipei (TW)

(72) Inventors: Cheng-Ting Hsu, New Taipei (TW); Yung-Huang Liao, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/381,883

(22) Filed: Oct. 19, 2023

(65) Prior Publication Data

US 2024/0331793 A1    Oct. 3, 2024

Related U.S. Application Data

(62) Division of application No. 18/127,775, filed on Mar. 29, 2023.

(51) Int. Cl.
*G11C 29/44*    (2006.01)
*G11C 29/02*    (2006.01)
*G11C 29/08*    (2006.01)
*G11C 29/52*    (2006.01)
*G11C 29/56*    (2006.01)

(52) U.S. Cl.
CPC ............ *G11C 29/44* (2013.01); *G11C 29/027* (2013.01); *G11C 29/08* (2013.01); *G11C 29/52* (2013.01); *G11C 29/56* (2013.01); *G11C 2029/4402* (2013.01); *G11C 2229/763* (2013.01)

(58) Field of Classification Search
CPC ......... G11C 29/44; G11C 29/52; G11C 29/56; G11C 2029/4402; G11C 29/08; G11C 29/027; G11C 2229/763
USPC .......................................... 714/718, 719, 723
See application file for complete search history.

(56) References Cited

U.S. PATENT DOCUMENTS 6,952,623 B2 * 10/2005 McAdams .............. G11C 16/20
                                                                  700/121
2005/0172132 A1 * 8/2005 Chen ..................... H04L 9/0844
                                                                  713/180
2005/0177741 A1 * 8/2005 Chen ................. H04N 21/26613
                                                                  726/1

(Continued)

OTHER PUBLICATIONS

Office Action and and the search report mailed on May 8, 2024 related to U.S. Appl. No. 18/127,775, wherein this application is a DIV of U.S. Appl. No. 18/127,775.

Primary Examiner — John J Tabone, Jr.
(74) Attorney, Agent, or Firm — Xuan Zhang

(57) ABSTRACT

The present disclosure provides a memory test system, including a tester and a processor. The tester is configured to perform a final test to the memory device to obtain a test result, and read a read-only data of the packaged memory device. The processor is coupled to the tester, configured to perform a function to transform the read-only data to a chip ID of the packaged memory device when the memory device does not pass the final test according to the test result. When the packaged memory device does not pass the final test, the processor is further configured to obtain a process history of the packaged memory device according to the chip ID.

9 Claims, 6 Drawing Sheets

(56) References Cited

U.S. PATENT DOCUMENTS

2008/0086641 A1* 4/2008 Rodgers .............. H04L 63/0435
713/176
2017/0256327 A1* 9/2017 Inoue ..................... G11C 29/16

* cited by examiner

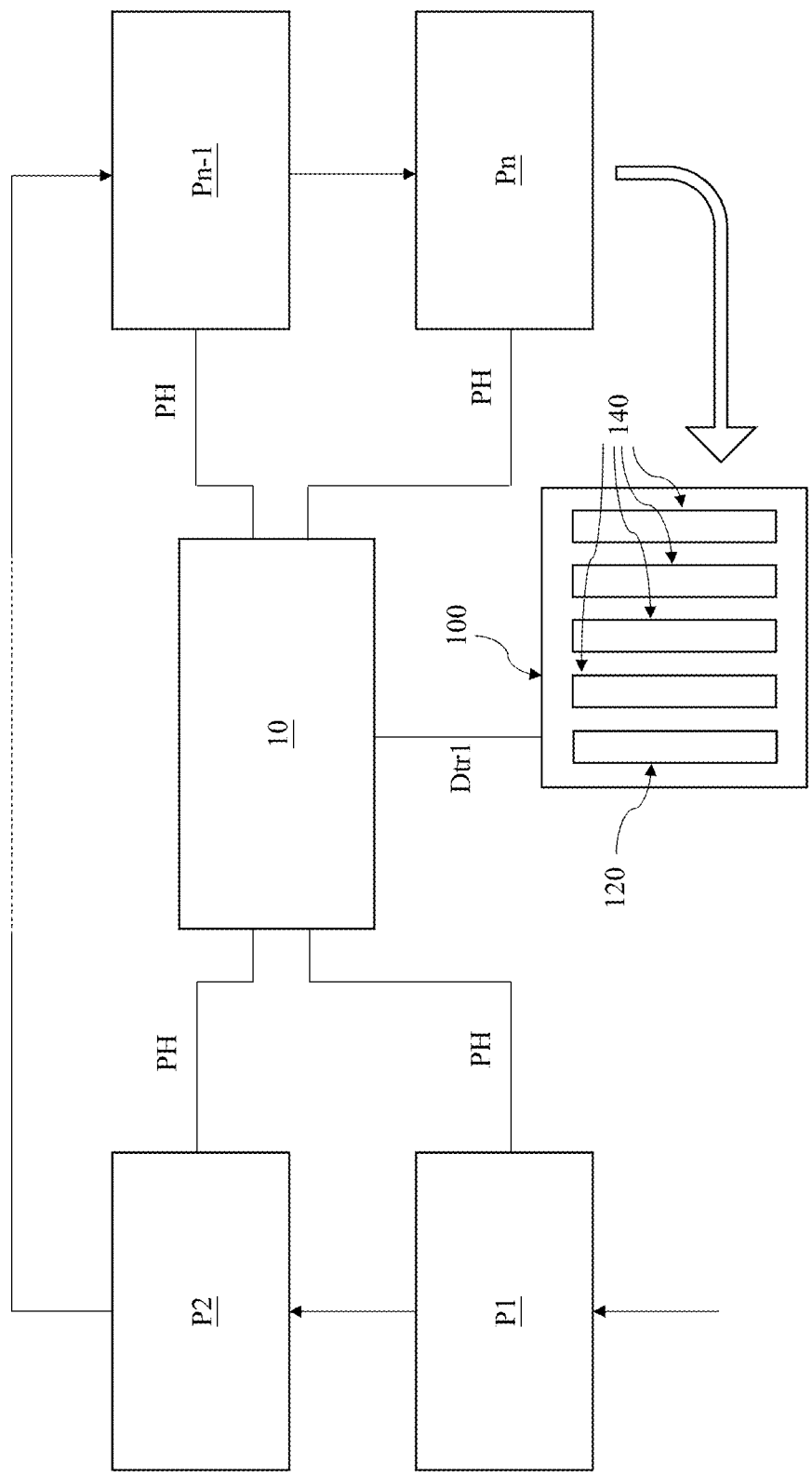

MEMORY TEST SYSTEM AND MEMORY TEST METHOD

CROSS-REFERENCE TO RELATED APPLICATION

This application is a divisional application of U.S. Non-Provisional application Ser. No. 18/127,775 filed Mar. 29, 2023, which is incorporated herein by reference in its entirety.

TECHNICAL FIELD

The present disclosure relates to a memory test system and a memory test method, and more particularly, to a memory test system and a memory test method for performing a circuit probe test.

DISCUSSION OF THE BACKGROUND

When a dynamic random access memory (DRAM) is produced, the DRAM is tested before and after packaging. The processing log file of the DRAM has to be retrieved when the DRAM does not pass the test. Therefore, how to obtain the log file efficiently becomes an important issue in this field.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a memory test system, including a tester and a processor. The tester is configured to perform a final test to the memory device to obtain a test result, and read a read-only data of the packaged memory device. The processor is coupled to the tester, and configured to perform a function to transform the read-only data to a chip ID of the packaged memory device when the memory device does not pass the final test according to the test result. When the packaged memory device does not pass the final test, the processor is further configured to obtain a process history of the packaged memory device according to the chip ID.

In some embodiments, the packaged memory device includes a fuse bank and a plurality of memory banks. The fuse bank is configured to store the read-only data. The tester performs the final test to the plurality of memory banks to obtain the test result.

In some embodiments, the fuse bank is a read-only memory, and the plurality of memory banks are volatile memory.

In some embodiments, the function is implemented by C language.

In some embodiments, the tester is a Mosaidtester of Mosaid Technologies Inc.

In some embodiments, the processor is further configured to obtain a batch number, a manufacturing date, a die position on a wafer, and a version of the memory device according to the chip ID.

In some embodiments, the processor is further configured to examine the process history to determine whether at least one process for manufacturing the packaged memory device is performed inappropriately.

In some embodiments, when the at least one process is performed inappropriately, the processor is further configured to determine a batch of a wafer does not pass the circuit probe test. A memory device of the packaged memory device is diced from the wafer.

In some embodiments, the packaged memory device is a dynamic random access memory (DRAM).

Another aspect of the present disclosure provides a memory test method. The memory test method includes operations of: performing a plurality of processes to manufacture a packaged memory device; performing, by a tester, a final test to the packaged memory device to generate a test result; when the packaged memory device does not pass the final test, reading, by the tester, a read-only data from a fuse bank of the packaged memory device; performing, by a processor, a function to transform the read-only data to a chip ID of the packaged memory device; and obtaining a process history of the packaged memory device according to the chip ID.

In some embodiments, the final test is performed to a plurality of memory banks of the packaged memory device, wherein the plurality of memory banks are volatile memory.

In some embodiments, the fuse bank is a read-only memory.

In some embodiments, the function is implemented by C language.

In some embodiments, the memory test method further includes obtaining, by the processor, a batch number, a manufacturing date, a die position on a wafer, and a version of the packaged memory device according to the chip ID.

In some embodiments, the memory test method further includes examining, by the processor, the process history to determine whether at least one process of the plurality of processes is performed inappropriately.

In some embodiments, the memory test method further includes when the at least one process is performed inappropriately, determining, by the processor, a batch of a wafer does not pass the circuit probe test. A memory device of the packaged memory device is diced from the wafer.

In some embodiments, the packaged memory device is a dynamic random access memory (DRAM).

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIG. 1A and FIG. 1B are schematic diagrams of a memory test system according to some embodiments of the present disclosure.

DETAILED DESCRIPTION

Figure 1B:
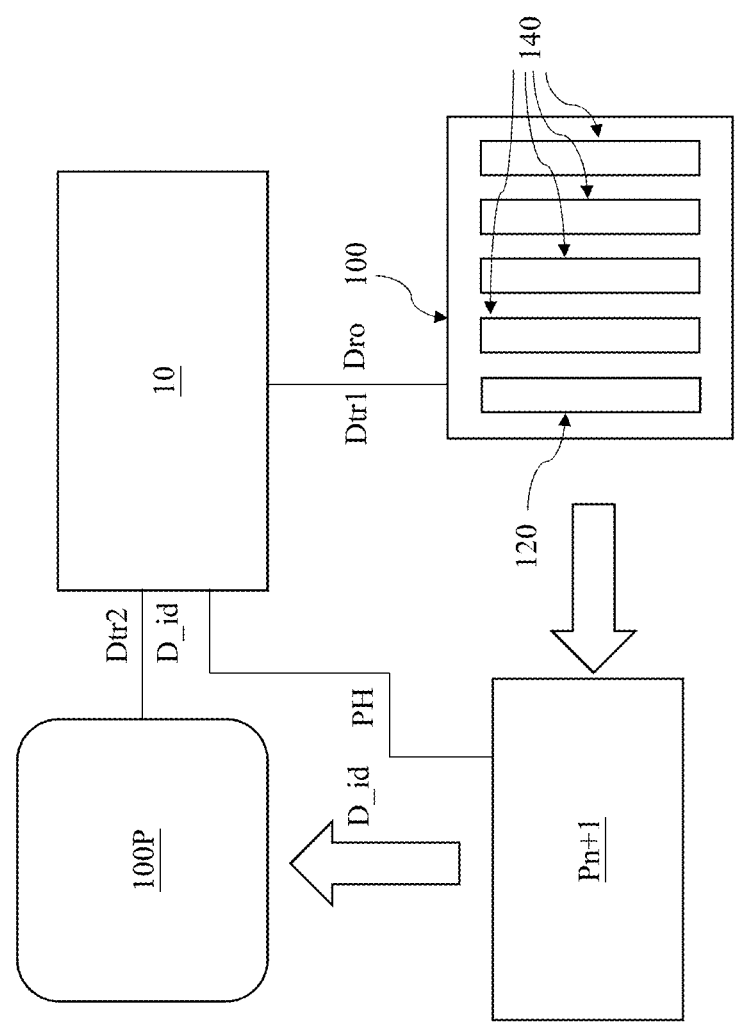

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1A is a schematic diagram of a memory test system 10 according to some embodiments of the present disclosure. In some embodiments, the memory test system 10 is configured to test a memory device 100 before the memory device 100 is packaged.

A process P1 to a process Pn are sequentially performed to manufacture the memory device 100. To facilitate understanding, the process P1, P2, Pn−1, and Pn are illustrated in FIG. 1A, and a dash line between the processes P2 and Pn−1 indicates processes P3 to Pn−2. It should be noted that present disclosure does not limit the number of processes for manufacturing the memory device 100.

In some embodiments, when the processes P1 to Pn are performed, a process history PH of the memory device 100 corresponding to respective processes P1 to Pn are generated.

After the process Pn, the memory device 100 is produced and ready to be tested. The memory test system 10 is configured to perform a circuit probe test to the memory device 100 to obtain a test result Dtr1. The memory test system 10 is coupled to the processes P1 to Pn, so as to make the memory test system 10 be able to access the process history PH of the memory device 100 in each process P1 to Pn. In some embodiments, when the test result Dtr1 shows that the memory device 100 does not pass a requirement of the memory device 100, the memory device 100 is dropped out from the manufacturing process. In some embodiments, when the test result Dtr1 shows that the memory device 100 passes the requirement of the memory device 100, the memory device 100 is proceeds to a packaging process Pn+1 (shown in FIG. 1B).

Reference is made to FIG. 1B. FIG. 1B is a schematic diagram of a memory test system 10 according to some embodiments of the present disclosure. In some embodiments, the memory test system 10 is further configured to test a memory device 100 after the memory device 100 is packaged.

After the memory device 100 passes the circuit probe test, the memory device 100 is packaged by performing the packaging process Pn+1, and a packaged memory device 100P is generated. Similarly, the memory test system 10 is coupled to the packaging processes Pn+1, so as to make the memory test system 10 be able to access a process history PH of the memory device 100 in packaging process Pn+1.

The memory test system 10 is configured test the packaged memory device 100P. In particularly, a final test is performed by the memory test system 10 to the packaged memory device 100P. In some embodiments, the final test at least includes a high-pot test and a high-temperature test. A test result Dtr2 of the final test is thus generated.

A chip ID D_id of the memory device 100 is defined during the packaging process Pn+1. The chip ID D_id is an identification of the memory device 100, and the memory test system 10 can obtained the process history PH of at least one process in the processes P1 to Pn+1 according to the chip ID D_id so as to examine whether at least one process was performed inappropriately.

In some embodiments, the memory device 100/packaged memory device 100P is a dynamic random access memory (DRAM). The memory device 100/packaged memory device 100P includes a fuse bank 120 and a plurality of memory banks 140.

The fuse bank 120 is a read-only portion of the memory device 100, and configured store a read-only data Dro. In some embodiments, the chip ID D_id of the memory device 100 is stored in the fuse bank 120 when the packaged memory device 100P is produced. More specifically, the fuse bank 120 is programmed during the packaging process Pn+1, and the chip ID D_id is written into the fuse bank 120 to be at least part of read-only data Dro. Alternatively stated, the read-only data Dro includes the information of chip ID D_id of the memory device 100.

The plurality of memory banks 140 are volatile memory in the memory device 100. Generally speaking, while the memory device 100 is in use, the memory banks 140 are the main portion of the memory device 100 being accessed. The fuse bank 120 does not be read during the normal operation, and cannot be written either.

In other embodiments, the memory test system 10 is configured to test the packaged memory device 100P which is returned from customers, such as the packaged memory device 100P is returned under Return Merchandise Authorization (RMA).

Figure 2:
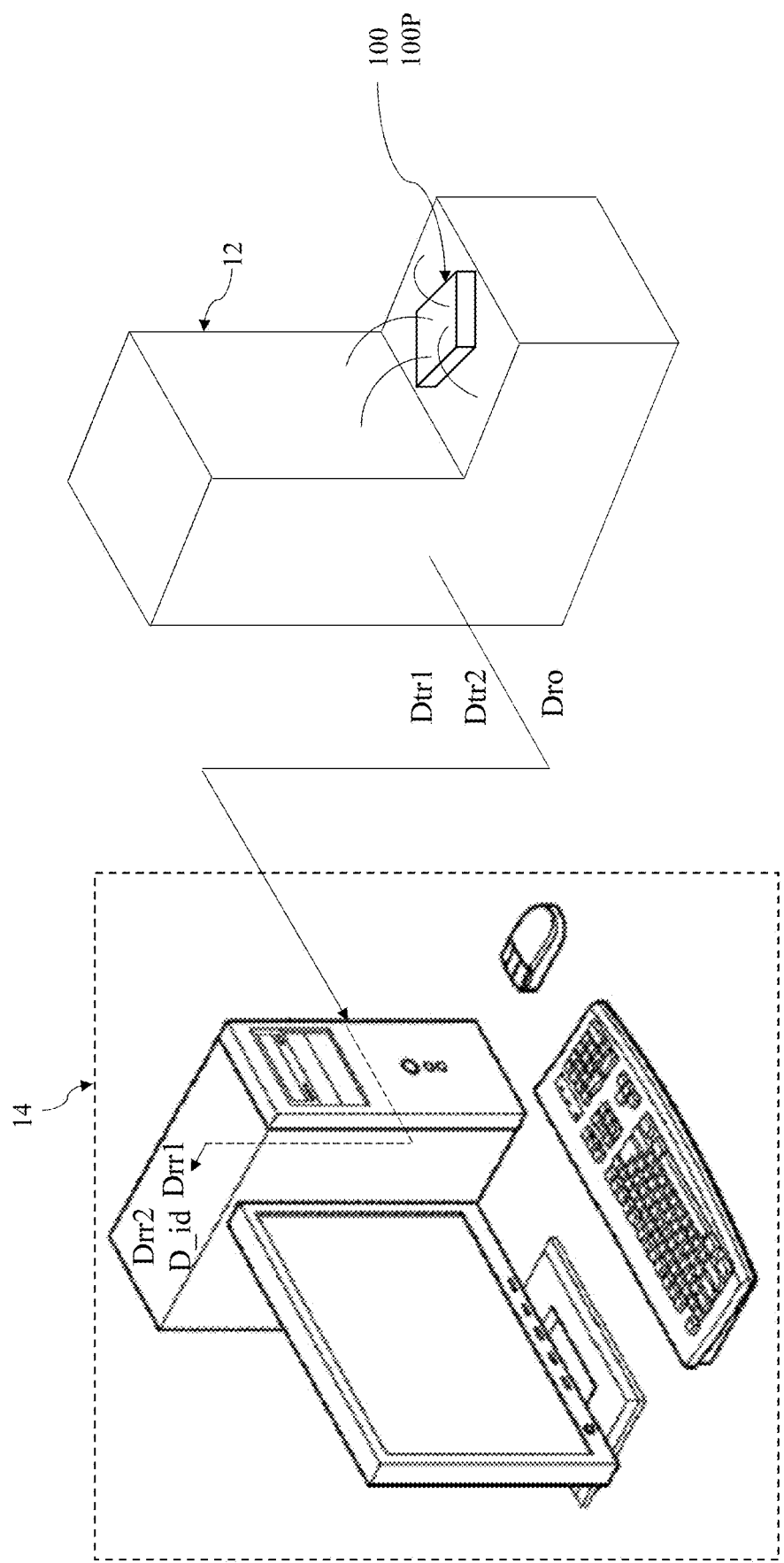
FIG. 2 is a schematic diagram of details in the memory test system according to some embodiments of the present disclosure.

Reference is made to FIG. 2. FIG. 2 is a schematic diagram of details in the memory test system 10 according to some embodiments of the present disclosure. The memory test system 10 includes a tester 12 and a processor 14.

The tester 12 is connected to the memory device 100 and the packaged memory device 100P, and configured to respectively perform the circuit probe test to the memory device 100 and the final test to the packaged memory device 100P to obtain the test result Dtr1, and the test result Dtr2. More particularly, the tester 12 performs the circuit probe test to the plurality of memory banks 140 to obtain the test result Dtr1, and the final test to the plurality of memory banks 140 to obtain the test result Dtr2.

The processor 14 is coupled to the tester 12, and configured to receive the test result Dtr1 and the test result Dtr2. In some embodiments, the processor 14 is configured to analyze the test result Dtr1 and the test result Dtr2 to determine whether the memory device 100 and the packaged memory device 100P passes the circuit probe test and the final test, respectively.

In some embodiments, when the memory device 100 does not pass the circuit probe test and/or the final test, the processor 14 indicates that the memory device 100 and/or the packaged memory device 100P is failed. In some embodiments, the memory device 100 is diced from a wafer, and the wafer is manufactured by batch. When the memory device 100 and/or the packaged memory device 100P is failed for some non-ideal reasons, it has possibility that the memory devices in the whole batch are failed, because all of the memory devices in the some batch experienced the same processes. Therefore, in some embodiments, when the processor 14 determines that the memory device 100 and/or the packaged memory device 100P does not pass the circuit probe test and/or the final test, the processor 14 further configured to determine the memory devices in whole batch are failed.

In other embodiments, when the memory device 100 and/or the packaged memory device 100P is failed, only the wafer originally including the failed memory device 100 is failed, and other wafers in the batch can still pass the circuit probe test and/or the final test.

In various embodiments, when the memory device 100 and/or the packaged memory device 100P is failed, only said memory device 100 is failed, and the rest memory devices in the same wafer can till pass the circuit probe test and the final test. In this embodiments, the processor 14 is further configured to obtain a location of the memory device 100 at the wafer. Alternatively stated, the memory device 100 is a die diced from the wafer, and the processor 14 obtains the said location which is the die position on the wafer.

In some conventional approaches, the test result is represented by row data, such as waveforms or digital binary codes. A technician has to translate the row data to a readable information so as to understand the result indicated by the raw data.

Compared to the conventional approaches, the memory test system 10 is able to transform the raw data of the test result Dtr1 and/or the test result Dtr2 into readable information. Therefore, the technician can directly read the test result Dtr1 and/or the test result Dtr2 more efficiently.

In some embodiments, the tester 12 is a Mosaid tester of Mosaid Technologies Inc, such as a MS4205 memory tester and/or a MS5205 memory tester. However, the present application does not limited thereto. Every suitable tester 12 is within the contemplated scope of the present disclosure.

When the packaged memory device 100P is failed, the tester 12 is configured to read the read-only data Dro and transmit the read-only data Dro to the processor 14. The processor 14 is configured to transform the read-only data Dro to the chip ID D_id. As mentioned above, the read-only data Dro includes the information of chip ID D_id, however, the read-only data Dro is presented by raw data. The processor 14 receives the read-only data Dro and decodes the same to obtain the chip ID D_id. For example, the read-only data Dro is represented by a hexadecimal number series, and the processor 14 is configured to transform the read-only data Dro to a decimal number series which is a readable information.

In some embodiments, the processor 14 is further configured to respectively transform the test result Dtr1 and the test result Dtr2 to a readable result Drr1 and a readable result Drr2, which are readable information for the technician.

In other embodiments, a transformation module external to the processer 14 is configured to transform the read-only data Dro, the test result Dtr1, and/or the test result Dtr2.

The processor 14 can execute functions to transform the read-only data Dro, the test result Dtr1, and/or the test result Dtr2. In some embodiments, the functions executed by the processor 14 are implemented by C language.

The process history PH of the memory device 100 can be retrieved according to the chip ID D_id. In some embodiments, a correspondence of the chip ID D_id and the process history PH is stored in a lookup table or a general memory unit of the memory test system 10. Therefore, the processor 14 is able to obtain the process history PH of the memory device 100 by searching the lookup table or accessing the general memory unit according to the chip ID D_id. In some embodiments, the process history PH includes parameters of the process, such as a temperature, a pressure, a time, and other process related parameters. In further embodiments, the process history PH includes a batch number, a manufacturing date, the die position on the wafer, and a version of the memory device 100.

The processor 14 is configured to examine the process history PH of the memory device 100 to determine whether at least one process in the processes P1 to Pn+1 is performed inappropriately.

For example, when the process P2 is a ion implementation process and the implementing duration of the implementation process does not exceed a lower bound, the ion concentration is lower than a requirement of the memory device 100, which results that a threshold voltage of transistors in the memory device 100 does not meet the requirement of the memory device 100. Therefore, the memory device 100 does not pass the final test. Under this condition, the processor 14 receives the test result Dtr1 to obtain the readable result Drr1, and detects the threshold voltage of the memory device 100 does not meet the requirement. The processor 14 further examines the process history PH so as to check whether a data of the implementing duration is abnormal. When the processor 14 determines that the process P2 (the implementation process) was performed inappropriately, the processor 14 further determines the batch of the wafer which including the memory device is failed because the whole batch was processed by the inappropriate process P2. The process P2 mentioned above is for illustrative purposes and not intended to be limiting. It should be appreciated that every process P1 to Pn+1 might have some non-ideal reason so as to being performed inappropriate.

Based on the above, the memory test system 10 has at least two opportunities to examine whether the memory device 100 meets the requirements, in which the first opportunity is to examine the result of the circuit probe test before the packaging process Pn+1, and the second opportunity is to examine the result of the final test after the packaging process Pn+1.

Figure 3A:
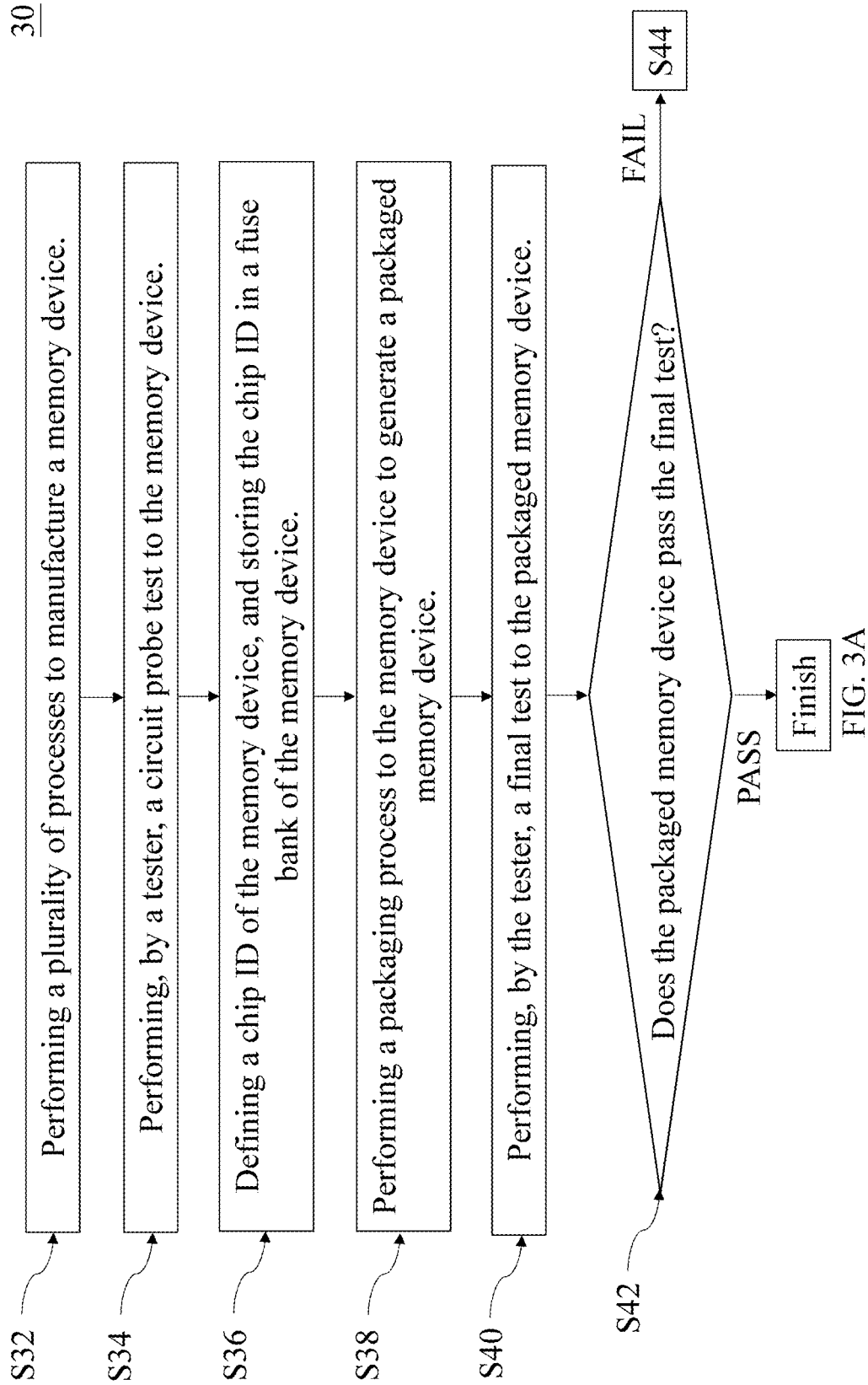
FIG. 3A and FIG. 3B are a flow chart of a memory test method according some embodiments of the present disclosure.
Figure 3B:
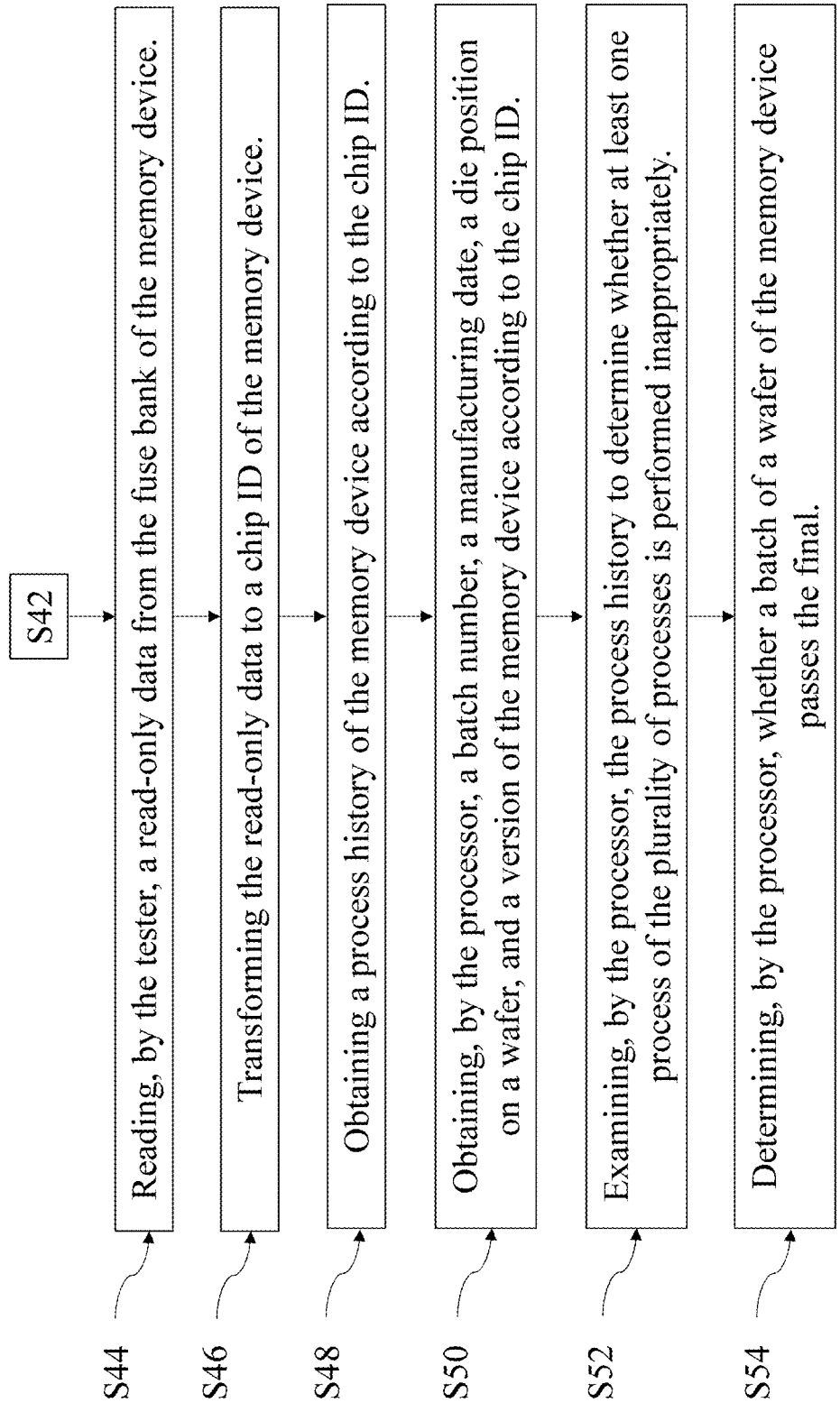

Reference is made to FIG. 3A and FIG. 3B. FIG. 3A and FIG. 3B are a flow chart of a memory test method 30 according to some embodiments of the present disclosure. In some embodiments, the memory test method 30 is configured to test the packaged memory device 100P. In some embodiments, the memory test method 30 is configured to test a DRAM device. In some embodiments, the memory test method 30 is performed by the memory test system 10. To facilitate understanding, the memory test method 30 is described with the same reference numerals shown in FIG. 1A, FIG. 1B, and FIG. 2.

The memory test method 30 includes operations S32, S34, S36, S38, S40, S42, S44, S46, S48, S50, S52, and S54.

In operation S32, the processes P1 to Pn are performed to manufacture the memory device 100.

In operation S34, the tester 12 performs the circuit probe test to the memory device 100 to generate the test result $D_{rt1}$. In some embodiments, the circuit probe test is performed to the memory banks 140 of the memory device 100, in which the memory banks 140 are volatile memory in the memory device 100.

In operation S36, when the memory device 100 passes the circuit probe test, the chip ID D_id of the memory device 100 is determined, and the chip ID D_id is stored in the fuse bank 120 of the memory device 100. The chip ID D_id is stored to be a part of read-only data Dro in the fuse bank 120.

In operation S38, the packaging process Pn+1 is performed to the memory device 100 to generate the packaged memory device 100P. In some embodiments, the operation S36 is operated during the operation S38.

In operation S40, the tester 12 performs the final test to the packaged memory device 100P to generate the test result Dtr2.

In operation S42, the processor 14 determines whether the packaged memory device 100P passes the final test according to the test result Dtr2. When the packaged memory device 100P passes the final test, the memory test method 30 completed. When the packaged memory device 100P does not pass the final test, the memory test method 30 proceeds to the operation S44.

In operation S44, the tester 12 reads the read only data Dro from the fuse bank 120 of the memory device 100.

In operation S46, the processor 14 receives the read-only data Dro and transforms the read-only data Dro to the chip ID D_id of the memory device 100. It should be noted that the chip ID D_id of the memory device 100 is the same as the chip ID D_id of the packaged memory device 100P.

In operation S48, the processor 14 obtains the process history PH of the memory device 100/packaged memory device 100P according to the chip ID D_id.

In operation S50, the processor 14 obtains the batch number, the manufacturing date, the die position on the wafer, and the version of the memory device 100/packaged memory device 100P according to the chip ID D_id.

In operation S52, the processor 14 examines the process history PH to determine whether any one of the processes P1 to Pn+1 is performed inappropriately. In some embodiments, the processor transforms the test result Dtr2 to the readable result Drr2, and the processor 14 further examines the test result Dtr2 and/or the readable result Drr2 to determine whether any one of the processes P1 to Pn+1 is performed inappropriately.

When there is at least on process in the processes P1 to Pn+1 being performed inappropriately, in operation S54, the processor 14 determines whether the batch of the wafer passes the final test, wherein the memory device 100 is diced from the wafer. In some embodiments, it is determined that the whole batch of the wafer does not pass the final test because the whole batch of the wafer experiences the same processes, and the whole batch is expected to have the same result after the final test. In other embodiments, it is determined that the whole batch of the wafer passes the final test except the memory device 100/packaged memory device 100P.

The above operations are provided for illustrative purposes, and the present disclosure is not limited thereto. Various operations and operated sequences are within the contemplated scope of the present disclosure. For example, in various embodiments, the operation S38 can be performed prior to the operation S36.

Figure 4:
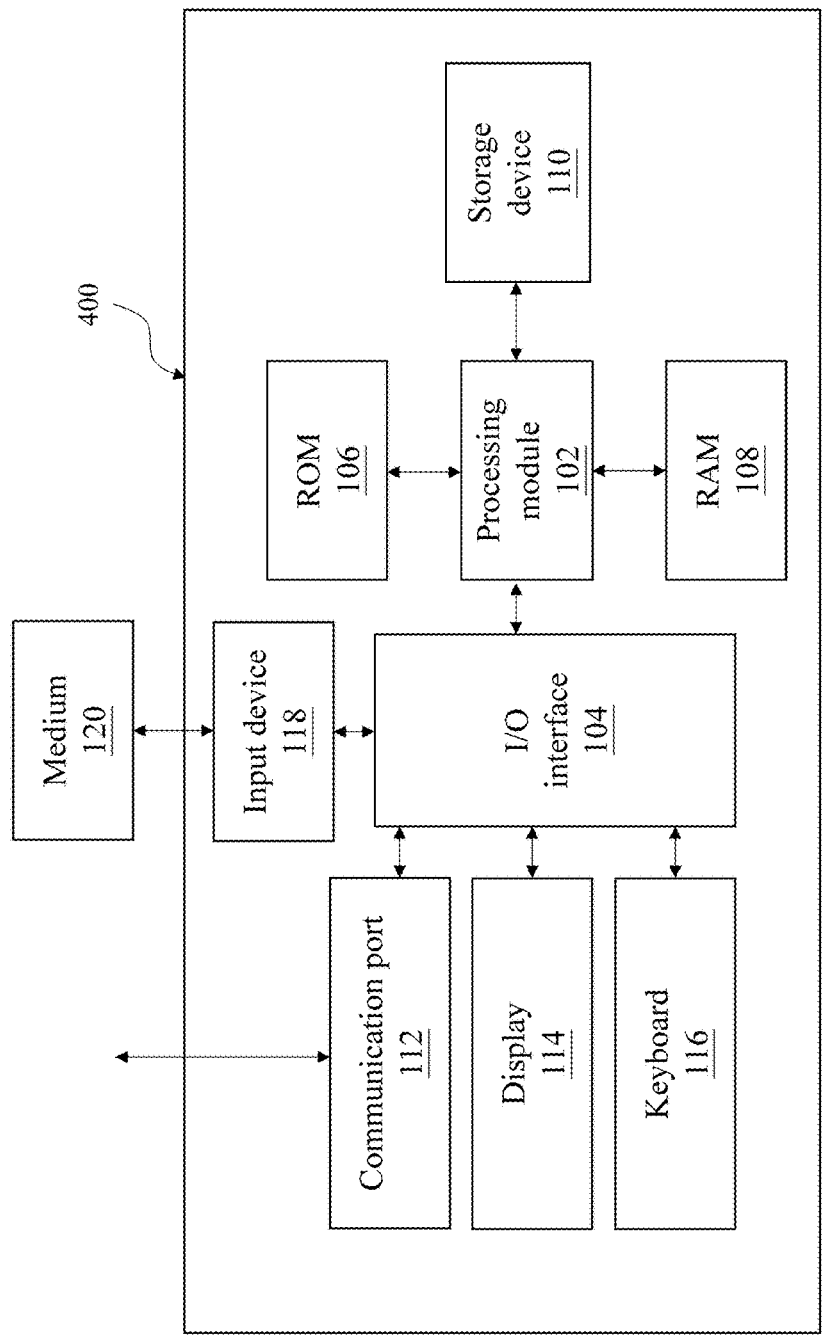
FIG. 4 is a schematic diagram of a computer according to some embodiments of the present disclosure.

Reference is made to FIG. 4. FIG. 4 is a schematic diagram of a computer 400 according to some embodiments of the present disclosure. In some embodiments, the computer 400 is implemented in the memory test system 10, and the processor 14 is included in the computer 400. To facilitate understanding, the computer 400 is described with the same numerals shown in FIG. 1 and FIG. 2.

In some embodiments, the computer 400 includes a processing module 402 such as the processor 14, an input/output (I/O) interface 404 electrically coupled to the processing module 402, a read-only memory (ROM) 406, a random access memory (RAM) 408, and a storage device 410. The ROM 406, the RAM 408, and the storage device 410 are communicatively coupled to the processing module 402.

The computer 400 further includes a communication port 412 configured to transmit instructions to control the tester 12, a display 414, a keyboard 416, and an input device 418. The input device 418 may include a card reader, an optical disk drive or any other device that allows the computer 400 to receive input from the on-site technicians. In some embodiments, the tester 12 receives commands through the computer 400, in which the commands are inputted by the on-site technicians. In some embodiments, the input device 418 is configured to input computer instructions (software algorithms) stored in a non-transitory computer-readable medium 420, and the processing module 402 is configured to execute operations for performing the method 30 according to the computer instructions. In some embodiments, the processing module 402 reads software algorithms from the input device 418 or the storage device 410, executes the calculation steps, and stores the calculated result in the RAM 408. In some embodiments, the non-transitory computer-readable medium 420 is combined with the processor 14.

One aspect of the present disclosure provides a memory test system, including a tester and a processor. The tester is configured to perform a final test to a packaged memory device to obtain a test result, and read a read-only data of the packaged memory device. The processor is coupled to the tester, configured to perform a function to transform the read-only data to a chip ID of the packaged memory device when the packaged memory device passes the final test according to the test result. When the packaged memory device does not pass the final test, the processor is further configured to obtain a process history of the packaged memory device according to the chip ID.

Another aspect of the present disclosure provides a memory test method. The memory test method includes operations of: performing a plurality of processes to manufacture a packaged memory device; performing, by a tester, a final test to the packaged memory device to generate a test result; when the packaged memory device does not pass the final test, reading, by the tester, a read-only data from a fuse bank of the packaged memory device; performing, by a processor, a function to transform the read-only data to a chip ID of the packaged memory device; and obtaining a process history of the packaged memory device according to the chip ID.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A memory test method, comprising:
    performing a plurality of processes to manufacture a packaged memory device;
    performing, by a tester, a final test to the packaged memory device to generate a test result;
    when the packaged memory device does not pass the final test, reading, by the tester, a read-only data from a fuse bank of the packaged memory device;
    performing, by a processor, a function to transform the read-only data to a chip ID of the packaged memory device;
    obtaining a process history of the packaged memory device according to the chip ID; and
    obtaining, by the processor, a batch number, a manufacturing date, a die position on a wafer, and a version of the packaged memory device according to the chip ID;
    wherein the fuse bank is a read-only memory.

2. The memory test method of claim 1, wherein the final test is performed to a plurality of memory banks of the packaged memory device, wherein the plurality of memory banks are volatile memory.

3. The memory test method of claim 1, wherein the function is implemented by C language.

4. The memory test method of claim 1, further comprising:
    examining, by the processor, the process history to determine whether at least one process of the plurality of processes is performed inappropriately.

5. The memory test method of claim 4, further comprising:
    when the at least one process is performed inappropriately, determining, by the processor, a batch of a wafer does not pass the circuit probe test, wherein a memory device of the packaged memory device is diced from the wafer.

6. The memory test method of claim 1, wherein the packaged memory device is a dynamic random access memory (DRAM).

7. The memory test method of claim 1, wherein the processes are sequentially to manufacture the packaged memory device.

8. The memory test method of claim 1, wherein at least one of the processes is an ion implementation process.

9. The memory test system of claim 1, wherein the fuse bank stores the chip ID.

* * * * *